US010395920B2

(12) United States Patent
Vrtis et al.

(10) Patent No.: US 10,395,920 B2
(45) Date of Patent: Aug. 27, 2019

(54) ALKYL-ALKOXYSILACYCLIC COMPOUNDS

(71) Applicant: Versum Materials US, LLC, Tempe, AZ (US)

(72) Inventors: Raymond Nicholas Vrtis, Carefree, AZ (US); Robert Gordon Ridgeway, Chandler, AZ (US); Jianheng Li, Santa Clara, CA (US); William Robert Entley, Gilbert, AZ (US); Jennifer Lynn Anne Achtyl, Chandler, AZ (US); Xinjian Lei, Vista, CA (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 15/889,687

(22) Filed: Feb. 6, 2018

(65) Prior Publication Data

US 2018/0233355 A1 Aug. 16, 2018

Related U.S. Application Data

(62) Division of application No. 14/732,250, filed on Jun. 5, 2015, now Pat. No. 9,922,818.
(Continued)

(51) Int. Cl.
*H01L 29/08* (2006.01)
*H01L 21/02* (2006.01)
(Continued)

(52) U.S. Cl.
CPC ........ *H01L 21/02274* (2013.01); *C23C 16/30* (2013.01); *C23C 16/56* (2013.01);
(Continued)

(58) Field of Classification Search
CPC ............... H01L 21/02; H01L 21/02274
(Continued)

(56) References Cited

U.S. PATENT DOCUMENTS 6,005,128 A * 12/1999 Tamao ............... C07F 7/10
534/558
6,054,206 A 4/2000 Mountsier
(Continued)

FOREIGN PATENT DOCUMENTS

EP 1037275 9/2000
EP 1119035 7/2001
(Continued)

OTHER PUBLICATIONS

A. Grill, et al, Ultralow-k dielectrics prepared by plasma-enhanced chemical vapor deposition, Applied Physics Letters, 2001, 803-805.
(Continued)

Primary Examiner — Caleb E Henry
(74) Attorney, Agent, or Firm — Joseph D. Rossi

(57) ABSTRACT

A method and composition for producing a low k dielectric film via chemical vapor deposition is provided. In one aspect, the method comprises the steps of: providing a substrate within a reaction chamber; introducing into the reaction chamber gaseous reagents including at least one structure-forming precursor comprising a silacyclic compound, and a porogen; applying energy to the gaseous reagents in the reaction chamber to induce reaction of the gaseous reagents to deposit a preliminary film on the substrate, wherein the preliminary film contains the porogen, and the preliminary film is deposited; and removing from the preliminary film at least a portion of the porogen contained therein and provide the film with pores and a dielectric constant of 2.7 or less.

14 Claims, 3 Drawing Sheets

Related U.S. Application Data

(60) Provisional application No. 62/012,724, filed on Jun. 16, 2014.

(51) Int. Cl.
*H01B 3/18* (2006.01)
*C23C 16/30* (2006.01)
*C23C 16/56* (2006.01)

(52) U.S. Cl.
CPC ......... *H01B 3/18* (2013.01); *H01L 21/02126* (2013.01); *H01L 21/02203* (2013.01); *H01L 21/02216* (2013.01); *H01L 21/02348* (2013.01)

(58) Field of Classification Search
USPC ............................................ 438/759; 257/40
See application file for complete search history.

(56) References Cited

U.S. PATENT DOCUMENTS

| | | | |
|---|---|---|---|
| 6,132,814 A | 10/2000 | Livesay et al. | |
| 6,171,945 B1 | 1/2001 | Mandal et al. | |
| 6,204,201 B1 | 3/2001 | Ross | |
| 6,207,555 B1 | 3/2001 | Ross | |
| 6,238,751 B1 | 5/2001 | Mountsier | |
| 6,312,793 B1 | 11/2001 | Grill et al. | |
| 6,583,048 B1* | 6/2003 | Vincent ............... | B05D 1/60 257/E21.26 |
| 6,583,049 B2 | 6/2003 | Suzuki et al. | |
| 6,846,515 B2 | 1/2005 | Vrtis et al. | |
| 7,500,397 B2 | 3/2009 | Weigel et al. | |
| 8,293,001 B2 | 10/2012 | Vrtis et al. | |
| 8,637,396 B2 | 1/2014 | Matz et al. | |
| 8,753,985 B2 | 6/2014 | Underwood et al. | |
| 8,753,986 B2 | 6/2014 | Haas et al. | |
| 2003/0232137 A1* | 12/2003 | Vrtis ................. | C23C 16/401 427/248.1 |
| 2004/0216641 A1* | 11/2004 | Hamada ............... | C09D 4/00 106/287.16 |
| 2008/0009141 A1 | 1/2008 | Dubois et al. | |
| 2008/0113178 A1* | 5/2008 | Lazovsky ............. | B82Y 30/00 428/304.4 |
| 2008/0268177 A1* | 10/2008 | Vrtis ....................... | C23C 16/30 427/585 |
| 2009/0325381 A1* | 12/2009 | Chan ................. | H01L 21/02164 438/675 |
| 2010/0022792 A1 | 1/2010 | Shen | |
| 2010/0289013 A1* | 11/2010 | Ito ........................ | C07C 13/567 257/40 |
| 2010/0295029 A1* | 11/2010 | Kawamura ............ | C07C 15/20 257/40 |
| 2011/0198578 A1* | 8/2011 | Heuser ............... | H01L 51/0062 257/40 |
| 2013/0075876 A1* | 3/2013 | Goethals ............. | H01L 21/3105 257/642 |
| 2013/0079484 A1* | 3/2013 | Jeong .................... | C08G 77/04 528/43 |
| 2013/0260575 A1 | 10/2013 | Al-Rashid et al. | |
| 2016/0049293 A1* | 2/2016 | Li ........................ | C23C 16/401 438/780 |

FOREIGN PATENT DOCUMENTS

| | | |
|---|---|---|
| EP | 1959485 | 2/2008 |
| WO | 200024050 | 4/2000 |

OTHER PUBLICATIONS

S. Chattopadhyay, et al, Electron beam modification of thermoplastic elastomeric blends made from polyolefins, Journal of Materials Science, 2001, 4323-4330.

G. Kloster, et al, Porosity Effects on Low-k Dielectric Film Strength and Interfacial Adhesion, Proceedings of IITC, Jun. 3-5, 2002, San Francisco, CA.

A.M. Krapivin, et al., "The NMR Study and CND0/2 Molecular Orbital Calculation of Silacyclobutanes", Journal of Organometallic Chemistry, 1980, 9-33.

* cited by examiner

ALKYL-ALKOXYSILACYCLIC COMPOUNDS

CROSS-REFERENCE OF RELATED APPLICATIONS

This application is a divisional of U.S. patent application Ser. No. 14/732,250 filed Jun. 5, 2015 which, in turn, claims priority to and the benefit of U.S. provisional patent application Ser. No. 62/012,724, filed Jun. 16, 2014, which is incorporated herein by reference in its entirety.

BACKGROUND OF THE INVENTION

Described herein is a composition and method for the formation of a dielectric film using alkyl-alkoxysilacyclic compounds as a structure former precursor(s). More specifically, described herein is a composition and method for formation of a porous low dielectric constant ("low k" film or film having a dielectric constant of about 2.7 or less) film wherein the method is used to deposit the film is a chemical vapor deposition (CVD) method. The dielectric films, produced by the compositions and methods described herein, can be used, for example, as insulating layers in electronic devices.

The electronics industry utilizes dielectric materials as insulating layers between circuits and components of integrated circuits (IC) and associated electronic devices. Line dimensions are being reduced in order to increase the speed and memory storage capability of microelectronic devices (e.g., computer chips). As the line dimensions decrease, the insulating requirements for the interlayer dielectric (ILD) become much more rigorous. Shrinking the spacing requires a lower dielectric constant to minimize the RC time constant, where R is the resistance of the conductive line and C is the capacitance of the insulating dielectric interlayer. Capacitance (C) is inversely proportional to spacing and proportional to the dielectric constant (k) of the interlayer dielectric (ILD). Conventional silica ($SiO_2$) CVD dielectric films produced from $SiH_4$ or TEOS ($Si(OCH_2CH_3)_4$, tetraethylorthosilicate) and $O_2$ have a dielectric constant k greater than 4.0. There are several ways in which industry has attempted to produce silica-based CVD films with lower dielectric constants, the most successful being the doping of the insulating silicon oxide film with organic groups providing dielectric constants ranging from about 2.7 to about 3.5. This organosilica glass is typically deposited as a dense film (density ~1.5 g/cm$^3$) from an organosilicon precursor, such as a methylsilane or siloxane, and an oxidant, such as $O_2$ or $N_2O$. Organosilica glass will be herein be referred to as OSG. As dielectric constant or "k" values drop below 2.7 with higher device densities and smaller dimensions, the industry has exhausted most of the suitable low k compositions for dense films and has turned to various porous materials for improved insulating properties.

Patents, published applications, and publications in the field of porous ILD by CVD methods field include: EP 1 119 035 A2 and U.S. Pat. No. 6,171,945, which describe a process of depositing an OSG film from organosilicon precursors with labile groups in the presence of an oxidant such as $N_2O$ and optionally a peroxide, with subsequent removal of the labile group with a thermal anneal to provide porous OSG; U.S. Pat. Nos. 6,054,206 and 6,238,751, which teach the removal of essentially all organic groups from deposited OSG with an oxidizing anneal to obtain porous inorganic $SiO_2$; EP 1 037 275, which describes the deposition of an hydrogenated silicon carbide film which is transformed into porous inorganic $SiO_2$ by a subsequent treatment with an oxidizing plasma; and U.S. Pat. No. 6,312,793 B1, WO 00/24050, and a literature article Grill, A. Patel, V. Appl. Phys. Lett. (2001), 79(6), pp. 803-805, which all teach the co-deposition of a film from an organosilicon precursor and an organic compound, and subsequent thermal anneal to provide a multiphase OSG/organic film in which a portion of the polymerized organic component is retained. In the latter references, the ultimate final composition of the films indicate residual porogen and a high hydrocarbon film content of approximately 80 to 90 atomic %. Further, the final films retain the $SiO_2$-like network, with substitution of a portion of oxygen atoms for organic groups.

A challenge, which has been recognized in the industry, is that films with lower dielectric constants typically have higher porosity, which leads to enhanced diffusion of species into the films, specifically gas phase diffusion. This increased diffusion can result in increased removal of carbon from the porous OSG film from processes such as etching of the film, plasma ashing of photoresist, and $NH_3$ plasma treatment of copper surfaces. Carbon depletion in the OSG films can cause one or more of the following problems: an increase in the dielectric constant of the film; film etching and feature bowing during wet cleaning steps; moisture absorption into the film due to loss of hydrophobicity, pattern collapse of fine features during the wet clean steps after pattern etch and/or integration issues when depositing subsequent layers such as, without limitation, copper diffusion barriers, for example Ta/TaN or advanced Co or MnN barrier layers.

Possible solutions to one or more of these problems are to use porous OSG films with increased carbon content. A first approach is to use a porogen which results in a higher retention of Si-Methyl (Me) groups in the porous OSG layer. Unfortunately, as depicted in FIG. 1, the relationship between increasing Si-Me content typically leads to decreasing mechanical properties, thus the films with more Si-Me will negatively impact mechanical strength which is important for integration. A second approach has been to use a damage resistant porogen (DRP), such as, for example, the porogen disclosed in U.S. Pat. No. 8,753,985, which leaves additional amorphous carbon behind in the film after UV curing. In certain cases, this residual carbon does not negatively impact the dielectric constant nor the mechanical strength. It is difficult, however, to get significantly higher carbon contents in these films using the DRP.

Yet another solution proposed has been to use ethylene or methylene bridged disiloxanes of the general formula $R_x(RO)_{3-x}Si(CH_2)_ySiR_z(OR)_{3-z}$ where x=0-3, y=1 or 2, z=0-3. The use of bridged species is believed to avoid the negative impact to the mechanical by replacing bridging oxygen with a bridging carbon chain since the network connectivity will remain the same. This arises from the belief that replacing bridging oxygen with a terminal methyl group will lower mechanical strength by lowering network connectivity. In this manner one, can replace an oxygen atom with 1-2 carbon atoms to increase the atomic weight percent (%) C without lowering mechanical strength. These bridged precursors, however, generally have very high boiling points due to the increased molecular weight from having two silicon groups. The increased boiling point may negatively impact the manufacturing process by making it difficult to deliver the chemical precursor into the reaction chamber as a gas phase reagent without condensing it in the vapor delivery line or process pump exhaust.

Thus, there is a need in the art for a dielectric precursor that provides a film with increased carbon content upon deposition yet does not suffer the above-mentioned drawbacks.

BRIEF SUMMARY OF THE INVENTION

The method and composition described herein fulfill one or more needs described above. The method and composition described herein use an alkyl-alkoxysilacyclic compound(s) such as, for example, 1-methyl-1-ethoxysilacyclopantane (MESCAP), as the structure former which after co-deposition with a porogen precursor and, after UV curing to remove the porogen and harden the as-deposited film, provides a porous low k dielectric film that has similar mechanical properties as the films that use a prior art structure former such as diethoxymethylsilane (DEMS) at the same dielectric constant. Further, the films deposited using the alkyl-alkoxysilacyclic compounds described herein as the structure former precursor(s) comprise a relatively higher amount of carbon. In addition, the alkyl-alkoxysilacyclic compound(s) described herein have a lower molecular weight (Mw) relative to other prior art structure-former precursors such as bridged precursors, (e.g., disilane or disiloxane precursors) which by nature of having 2 silicon groups have a higher Mw and higher boiling points, thereby making the alkyl-alkoxysilacyclic precursors described herein more convenient to process, for example, in a high volume manufacturing process.

Described herein is a porous dielectric film comprising: a material represented by the formula $Si_vO_wC_xH_yF_z$, where $v+w+x+y+z=100\%$, v is from 10 to 35 atomic %, w is from 10 to 65 atomic %, x is from 5 to 45 atomic %, y is from 10 to 50 atomic % and z is from 0 to 15 atomic %, wherein the film has pores and a dielectric constant less than 2.7. In certain embodiments, the film comprises a higher carbon content (10-40%) as measured by X-ray photospectrometry (XPS) and exhibits a decreased depth of carbon removal when exposed to, for example an $O_2$ or $NH_3$ plasma as measured by examining the carbon content determined by XPS depth profiling.

In one aspect, there is provided a composition for a vapor deposition of a dielectric film comprising a silacyclic compound having the following Formula I:

wherein $R^1$ is independently selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group; $R^2$ is selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group; and $R^3$ is selected from a $C_3$ to $C_{10}$ alkyl di-radical which forms a four-membered, five-membered, or six-membered cyclic ring with the Si atom and wherein the compound is substantially free of one or more impurities selected from the group consisting of a halide and water.

In a further aspect, there is provided a chemical vapor deposition method for producing a porous dielectric film, comprising: providing a substrate into a reaction chamber; introducing gaseous reagents into the reaction chamber wherein the gaseous reagents comprise: a structure-forming precursor comprising a silacyclic compound having the following Formula I:

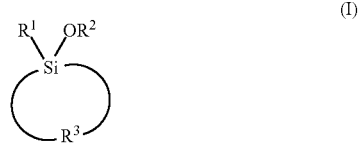

wherein $R^1$ is independently selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group; $R^2$ is selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group; and $R^3$ is selected from a $C_3$ to $C_{10}$ alkyl di-radical which forms a four-membered, five-membered, or six-membered cyclic ring with the Si atom, and a porogen; applying energy to the gaseous reagents in the reaction chamber to induce reaction of the gaseous reagents to deposit a preliminary film on the substrate, wherein the preliminary film contains the porogen; and removing from the preliminary film substantially all of the porogen to provide the porous film with pores and a dielectric constant less than 2.7. In certain embodiments, the structure-forming precursor further comprises a hardening additive.

DETAILED DESCRIPTION OF THE INVENTION

Figure 1:
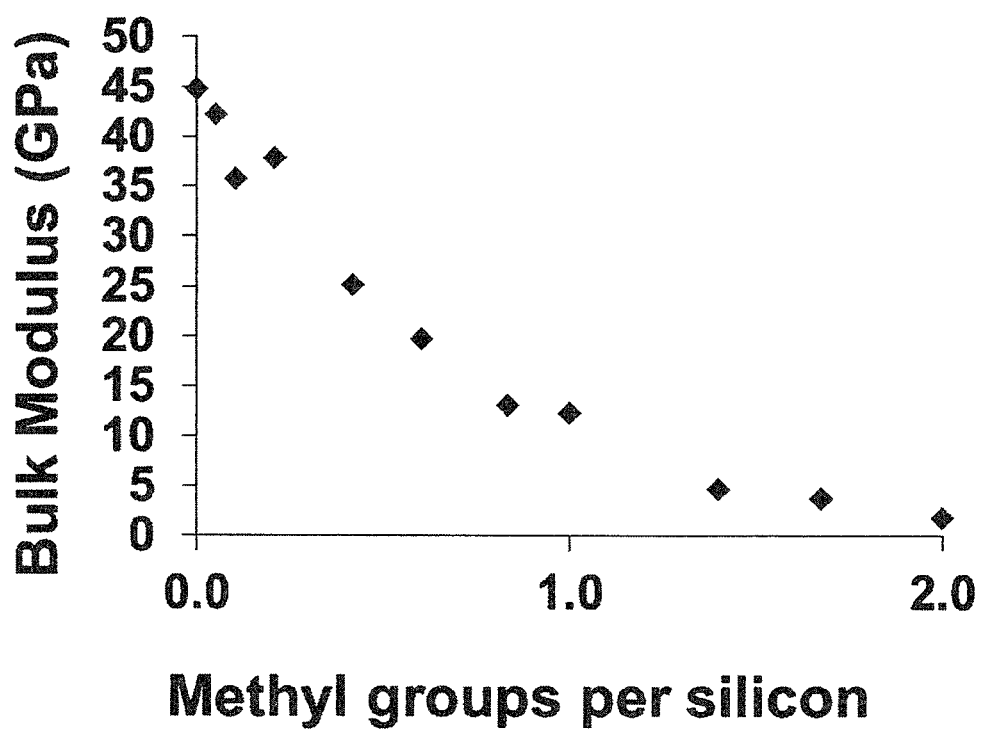
FIG. 1 is a graph showing the relationship between mechanical strength (Bulk Modulus GPa) and the Methyl (Me)/Si ratio in porous low k dielectric films obtained from computer modeling.

Described herein is a chemical vapor deposition (CVD) method for producing the porous low k dielectric film, comprising: providing a substrate within a reaction chamber; introducing into the reaction chamber gaseous reagents including at least one structure-forming precursor comprising an alkyl-alkoxysilacyclic compound (also referred to herein as a silacyclic compound) such as, for example, 1-methyl-1-ethoxy-1-silacyclopentane, and a porogen;

applying energy to the gaseous reagents in the reaction chamber to induce reaction of the gaseous reagents to deposit a preliminary film on the substrate, wherein the preliminary film contains the porogen and the organosilicate glass; and removing from the preliminary film substantially all of the porogen to provide the porous film with pores and a dielectric constant less than 2.7.

The alkyl-alkoxysilacyclic compounds described herein provide unique attributes that make it possible for one to incorporate more carbon content in the dielectric film with minor impact on the mechanical properties of the dielectric film compared to prior art structure former precursors such as diethoxymethylsilane (DEMS). For example, DEMS provides a mixed ligand system in DEMS with two alkoxy groups, one methyl and one hydride which offers a balance of reactive sites and allows for the formation of more mechanically robust films while retaining the desired dielectric constant desired. While not being bound by theory, the alkyl-alkoxysilacyclic precursors described herein such as 1-methyl-1-ethoxy-1-silacyclopentane are assymetric in nature and may offer advantages over more symmetric precursors such as 1,1-dimethyl-1-silacyclopentane or 1,1-diethoxy-1-silacyclopent-3-ene which have been proposed. The incorporation of one alkyl and one alkoxy group of the structure-forming precursor(s) described herein allows for a balance of mechanical strength and carbon incorporation at dielectric constant of 2.7 or less.

The low k dielectric films are organosilica glass ("OSG") films or materials. Organosilicates are candidates for low k materials, but without the addition of porogens to add porosity to these materials, their inherent dielectric constant is limited to as low as 2.7. The addition of porosity, where the void space has an inherent dielectric constant of 1.0, reduces the overall dielectric constant of the film, generally at the cost of mechanical properties. Material properties depend upon the chemical composition and structure of the film. Since the type of organosilicon precursor has a strong effect upon the film structure and composition, it is beneficial to use precursors that provide the required film properties to ensure that the addition of the needed amount of porosity to reach the desired dielectric constant does not produce films that are mechanically unsound. The method and composition described herein provides the means to generate porous low k dielectric films that have a desirable balance of electrical and mechanical properties as well as other beneficial film properties as high carbon content to provide improved integration plasma resistance.

In certain embodiments of the method and composition described herein, a layer of silicon-containing dielectric material is deposited on at a least a portion of a substrate via a chemical vapor deposition (CVD) process employing a reaction chamber. Suitable substrates include, but are not limited to, semiconductor materials such as gallium arsenide ("GaAs"), silicon, and compositions containing silicon such as crystalline silicon, polysilicon, amorphous silicon, epitaxial silicon, silicon dioxide ("SiO$_2$"), silicon glass, silicon nitride, fused silica, glass, quartz, borosilicate glass, and combinations thereof. Other suitable materials include chromium, molybdenum, and other metals commonly employed in semiconductor, integrated circuits, flat panel display, and flexible display applications. The substrate may have additional layers such as, for example, silicon, SiO$_2$, organosilicate glass (OSG), fluorinated silicate glass (FSG), boron carbonitride, silicon carbide, hydrogenated silicon carbide, silicon nitride, hydrogenated silicon nitride, silicon carbonitride, hydrogenated silicon carbonitride, boronitride, organic-inorganic composite materials, photoresists, organic polymers, porous organic and inorganic materials and composites, metal oxides such as aluminum oxide, and germanium oxide. Still further layers can also be germanosilicates, aluminosilicates, copper and aluminum, and diffusion barrier materials such as, but not limited to, TiN, Ti(C)N, TaN, Ta(C)N, Ta, W, or WN.

In certain embodiments of the method and described herein, the layer of silicon-containing dielectric material is deposited on at least a portion of the substrate by introducing into the reaction chamber gaseous reagents including at least one structure-forming precursor comprising an alkyl-alkoxysilacyclic compound and a porogen precursor.

The method and composition described herein use a silacyclic compound as the structure-forming precursor(s) according which have the following structure of Formula (I):

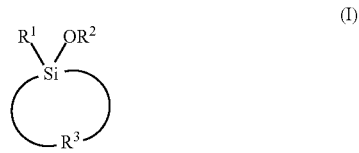

wherein $R^1$ is independently selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, a $C_3$ to $C_{10}$ hetero-aryl group; $R^2$ is selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, a $C_3$ to $C_{10}$ hetero-aryl group; and $R^3$ is selected from a $C_3$ to $C_{10}$ alkyl di-radical which forms a four-membered, five-membered, or six-membered cyclic ring with the Si atom.

In the formula above and throughout the description, the term "alkyl" denotes a linear or branched functional group having from 1 to 10 carbon atoms. Exemplary linear alkyl groups include, but are not limited to, methyl, ethyl, n-propyl, butyl, pentyl, and hexyl groups. Exemplary branched alkyl groups include, but are not limited to, iso-propyl, iso-butyl, sec-butyl, tert-butyl, iso-pentyl, tert-pentyl, iso-hexyl, and neo-hexyl. In certain embodiments, the alkyl group may have one or more functional groups attached thereto such as, but not limited to, an alkoxy group such as methoxy, ethoxy, iso-propoxy, and n-propoxy, a dialkylamino group such as dimethylamino or combinations thereof, attached thereto. In other embodiments, the alkyl group does not have one or more functional groups attached thereto. The alkyl group may be saturated or, alternatively, unsaturated.

In Formula I above and throughout the description, the term "cyclic alkyl" denotes a cyclic functional group having from 3 to 10 carbon atoms. Exemplary cyclic alkyl groups include, but are not limited to, cyclobutyl, cyclopentyl, cyclohexyl, and cyclooctyl groups.

In Formula I above and throughout the description, the term "hetero-cyclic" denotes a $C_3$ to $C_{10}$ hetero-cyclic alkyl group such as an epoxy group.

In Formula I above and throughout the description, the term "alkenyl group" denotes a group which has one or more carbon-carbon double bonds and has from 2 to 10 or from 2 to 10 or from 2 to 6 carbon atoms.

In Formula I above and throughout the description, the term "alkynyl group" denotes a group which has one or more carbon-carbon triple bonds and has from 3 to 10 or from 2 to 10 or from 2 to 6 carbon atoms.

In Formula I above and throughout the description, the term "aryl" denotes an aromatic cyclic functional group having from 5 to 10 carbon atoms, or from 6 to 10 carbon atoms. Exemplary aryl groups include, but are not limited to, phenyl, benzyl, chlorobenzyl, tolyl, and o-xylyl.

In Formula I above and throughout the description, the term "hetero-aryl" denotes a $C_3$ to $C_{10}$ hetero-cyclic aryl group 1,2,3-triazolyl, pyrrolyl, and furanyl.

In Formula I above, substituent $R^3$ is a $C_3$ to $C_{10}$ alkyl di-radical which forms a four-membered, five-membered, or six-membered cyclic ring with the Si atom. As the skilled person will understand, $R^3$ is a substituted or unsubstituted hydrocarbon chain which links with the Si atom together to form a ring in Formula I wherein the ring is a four-membered, five-membered, or six-membered ring. In these embodiments, the ring structure can be unsaturated such as, for example, a cyclic alkyl ring, or saturated, for example, an aryl ring.

In certain embodiments of Formula I, $R^1$ is selected from the group consisting of hydrogen, methyl, and ethyl, $R^2$ is selected from the group consisting of methyl, ethyl, and isopropyl, and $R^3$ forms a four-membered, five-membered, or six-membered cyclic ring with the Si atom. Examples of these embodiments are as follows:

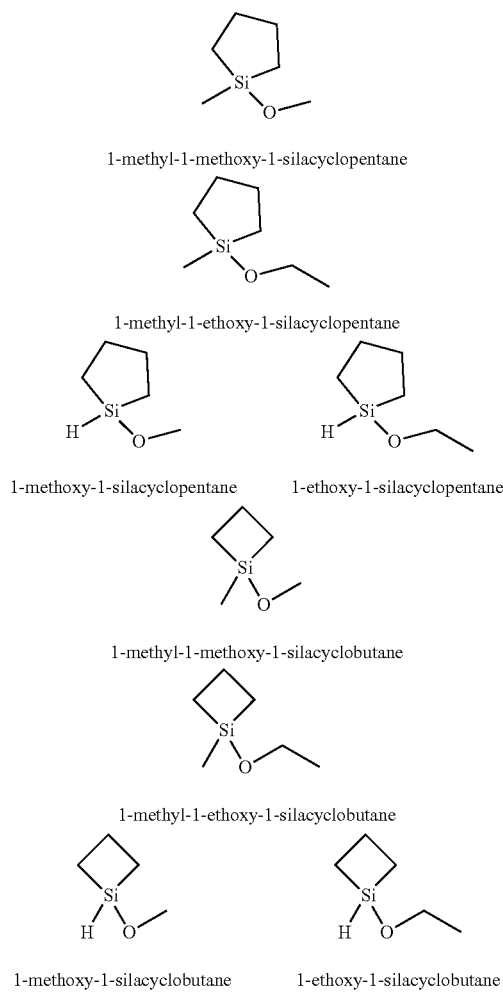

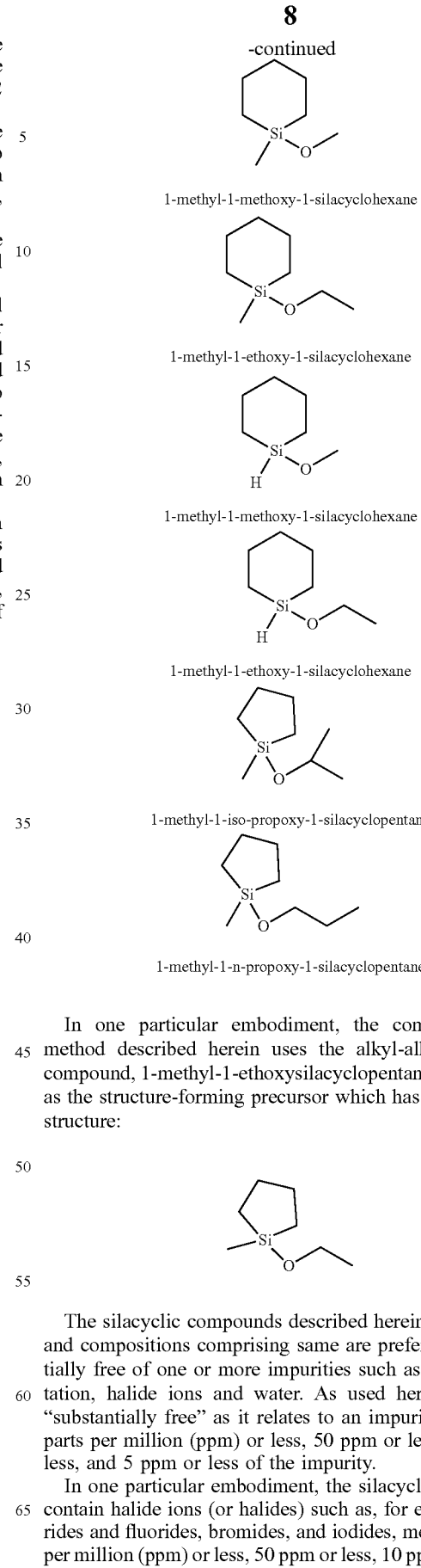

In one particular embodiment, the composition and method described herein uses the alkyl-alkoxysilacyclic compound, 1-methyl-1-ethoxysilacyclopentane (MESCAP), as the structure-forming precursor which has the following structure:

The silacyclic compounds described herein and methods and compositions comprising same are preferably substantially free of one or more impurities such as without limitation, halide ions and water. As used herein, the term "substantially free" as it relates to an impurity means 100 parts per million (ppm) or less, 50 ppm or less, 10 ppm or less, and 5 ppm or less of the impurity.

In one particular embodiment, the silacyclic compounds contain halide ions (or halides) such as, for example, chlorides and fluorides, bromides, and iodides, means 100 parts per million (ppm) or less, 50 ppm or less, 10 ppm or less, and 5 ppm or less of the impurity or 0 ppm. Chlorides are known to act as decomposition catalysts for alkyl-alkoxysilacyclic compounds as well as potential contaminate to detrimental to performance of electronic device. The gradual degradation of the silacyclic compounds may directly impact the film deposition process making it difficult for the semiconductor manufacturer to meet film specifications. In addition, the shelf-life or stability is negatively impacted by the higher degradation rate of the silacyclic compounds thereby making it difficult to guarantee a 1-2 year shelf-life. Therefore, the accelerated decomposition of the silacyclic compounds presents safety and performance concerns related to the formation of these flammable and/or pyrophoric gaseous byproducts.

Compositions according to the present invention that are substantially free of halides can be achieved by (1) reducing or eliminating chloride sources during chemical synthesis, and/or (2) implementing an effective purification process to remove chloride from the crude product such that the final purified product is substantially free of chlorides. Chloride sources may be reduced during synthesis by using reagents that do not contain halides such as chlorodisilanes, bromodisilanes, or iododisilanes thereby avoiding the production of by-products that contain halide ions. In addition, the aforementioned reagents should be substantially free of chloride impurities such that the resulting crude product is substantially free of chloride impurities. In a similar manner, the synthesis should not use halide based solvents, catalysts, or solvents which contain unacceptably high levels of halide contamination. The crude product may also be treated by various purification methods to render the final product substantially free of halides such as chlorides. Such methods are well described in the prior art and, may include, but are not limited to, purification processes such as distillation, or adsorption. Distillation is commonly used to separate impurities from the desire product by exploiting differences in boiling point. Adsorption may also be used to take advantage of the differential adsorptive properties of the components to effect separation such that the final product is substantially free of halide. Adsorbents such as, for example, commercially available MgO—Al$_2$O$_3$ blends can be used to remove halides such as chloride.

Whereas prior art silicon-containing structure-forming precursors, for example DEMS, polymerize, once energized in the reaction chamber, to form a structure having an —O— linkage (e.g., —Si—O—Si— or —Si—O—C—) in the polymer backbone, it is believed that silacyclic compounds, such as, for example, the MESCAP molecule polymerizes to form a structure where, some of the —O— bridge in the backbone is replaced with a —CH$_2$— methylene or —CH$_2$CH$_2$— ethylene bridge(s). In films deposited using DEMS as the structure forming precursor where the carbon exists mainly in the form of terminal Si-Me groups there is a relationship between the % Si-Me (directly related to % C) versus mechanical strength, see for example the modeling work shown in FIG. 1 where the replacement of a bridging Si—O—Si group with two terminal Si-Me groups decreases the mechanical properties because the network structure is disrupted. In the case of the silacyclic compounds it is believed that the cyclic structure is broken either during the film deposition or the cure process (to remove at least a portion of, or substantially all, of the porogen precursor contained in the as-deposited film) to form SiCH$_2$Si or SiCH$_2$CH$_2$Si bridging groups. In this manner, one can incorporate carbon in the form of a bridging group so that, from a mechanical strength view, the network structure is not disrupted by increasing the carbon content in the. Not being bound by theory, this attribute adds carbon to the film, which allows the film to be more resilient to carbon depletion of the porous OSG film from processes such as etching of the film, plasma ashing of photoresist, and NH$_3$ plasma treatment of copper surfaces. Carbon depletion in the OSG films can cause increases in the defective dielectric constant of the film, problems with film etching and feature bowing during wet cleaning steps, and/or integration issues when depositing copper diffusion barriers.

The composition for depositing the dielectric film described herein comprises: from about 5 to about 60 weight percent of structure forming precursor comprising the silacyclic compound(s) having Formula I; and from about 40 to about 95 weight percent or porogen precursor depending on the nature of the porogen precursor.

In certain embodiments of the method and composition comprised herein, the structure forming precursor further comprises a hardening additive which will increase the mechanical strength, examples of hardening additives are tetraalkoxysilanes, such as for example, tetrethoxysilane (TEOS) or tetramethoxysilane (TMOS). In embodiments wherein a hardening additive is used, the composition of the structure former portion comprises from about 30 to about 95 weight percent structure forming precursor comprising the silacyclic compound(s) having Formula I; from about 5 to about 70 weight percent of hardening additive; and about 40 to about 95 weight percent of the total precursor flow of porogen precursor.

As previously mentioned, the gaseous reagents further comprises one or more porogen precursors which is introduced into the reaction chamber along with the at least one structure-forming precursor comprising a silacyclic compound such as, for example, 1-methyl-1-ethoxysilacyclopentane. The following are non-limiting examples of materials suitable for use as porogens for use according to the present invention:

1) Cyclic hydrocarbons of the general formula $C_nH_{2n}$ where n=4-14, where the number of carbons in the cyclic structure is between 4 and 10, and where there can be a plurality of simple or branched hydrocarbons substituted onto the cyclic structure.
   Examples include: cyclohexane, 1,2,4-trimethylcyclohexane, 1-methyl-4-(1-methylethyl)cyclohexane, cyclooctane, methylcyclooctane, methylcyclohexane, etc.

2) Linear or branched, saturated, singly or multiply unsaturated hydrocarbons of the general formula $C_nH_{(2n+2)-2y}$ where n=2-20 and where y=0-n.
   Examples include: ethylene, propylene, acetylene, neohexane, 1,3-butadiene, 2-methyl-1,3-butadiene, 2,3-dimethyl-2,3-butadiene, substituted dienes, etc.

3) Singly or multiply unsaturated cyclic hydrocarbons of the general formula $C_nH_{2n-2x}$ where x is the number of unsaturated sites in the molecule, n=4-14, where the number of carbons in the cyclic structure is between 4 and 10, and where there can be a plurality of simple or branched hydrocarbons substituted onto the cyclic structure. The unsaturation can be located inside endocyclic or on one of the hydrocarbon substituents to the cyclic structure.
   Examples include, para-cymene, cyclooctene, 1,5-cyclooctadiene, dimethyl-cyclooctadiene, cyclohexene, vinyl-cyclohexane, dimethylcyclohexene, alpha-terpinene, pinene, limonene, vinyl-cyclohexene, etc.

4) Bicyclic hydrocarbons of the general formula $C_nH_{2n-2}$ where n=4-14, where the number of carbons in the bicyclic structure is between 4 and 12, and where there can be a plurality of simple or branched hydrocarbons substituted onto the cyclic structure.

Examples include, norbornane, spiro-nonane, decahydronaphthalene, etc.

5) Multiply unsaturated bicyclic hydrocarbons of the general formula $C_nH_{2n-(2+2x)}$ where x is the number of unsaturated sites in the molecule, n=4-14, where the number of carbons in the bicyclic structure is between 4 and 12, and where there can be a plurality of simple or branched hydrocarbons substituted onto the cyclic structure. The unsaturation can be located inside endocyclic or on one of the hydrocarbon substituents to the cyclic structure.

Examples include camphene, norbornene, norbornadiene, 5-Ethylidene-2-norbornene etc.

6) Tricyclic hydrocarbons of the general formula $C_nH_{2n-4}$ where n=4-14, where the number of carbons in the tricyclic structure is between 4 and 12, and where there can be a plurality of simple or branched hydrocarbons substituted onto the cyclic structure.

Examples include adamantane.

Although the phrase "gaseous reagents" is sometimes used herein to describe the reagents, the phrase is intended to encompass reagents delivered directly as a gas to the reactor, delivered as a vaporized liquid, a sublimed solid and/or transported by an inert carrier gas into the reactor.

In addition, the reagents can be carried into the reactor separately from distinct sources or as a mixture. The reagents can be delivered to the reactor system by any number of means, preferably using a pressurizable stainless steel vessel fitted with the proper valves and fittings to allow the delivery of liquid to the process reactor.

In addition to the structure forming species and the pore-forming species, additional materials can be introduced into the reaction chamber prior to, during and/or after the deposition reaction. Such materials include, e.g., inert gas (e.g., He, Ar, $N_2$, Kr, Xe, etc., which may be employed as a carrier gas for lesser volatile precursors and/or which can promote the curing of the as-deposited materials and provide a more stable final film) and reactive substances, such as oxygen-containing species such as, for example, $O_2$, $O_3$, and $N_2O$, gaseous or liquid organic substances, $NH_3$, $H_2$, $CO_2$, or CO. In one particular embodiment, the reaction mixture introduced into the reaction chamber comprises the at least one oxidant selected from the group consisting of $O_2$, $N_2O$, NO, $NO_2$, $CO_2$, water, $H_2O_2$, ozone, and combinations thereof. In an alternative embodiment, the reaction mixture does not comprise an oxidant.

Energy is applied to the gaseous reagents to induce the gases to react and to form the film on the substrate. Such energy can be provided by, e.g., plasma, pulsed plasma, helicon plasma, high density plasma, inductively coupled plasma, remote plasma, hot filament, and thermal (i.e., non-filament) and methods. A secondary rf frequency source can be used to modify the plasma characteristics at the substrate surface. Preferably, the film is formed by plasma enhanced chemical vapor deposition ("PECVD").

The flow rate for each of the gaseous reagents preferably ranges from 10 to 5000 sccm, more preferably from 30 to 1000 sccm, per single 200 mm wafer. The individual rates are selected so as to provide the desired amounts of structure-forming and porogen in the film. The actual flow rates needed may depend upon wafer size and chamber configuration, and are in no way limited to 200 mm wafers or single wafer chambers.

In certain embodiments, the film is deposited at a deposition rate of about 50 nanometers (nm) per minute.

The pressure in the reaction chamber during deposition ranges from about 0.01 to about 600 torr or from about 1 to 15 torr.

The film is preferably deposited to a thickness of 0.002 to 10 microns, although the thickness can be varied as required. The blanket film deposited on a non-patterned surface has excellent uniformity, with a variation in thickness of less than 2% over 1 standard deviation across the substrate with a reasonable edge exclusion, wherein e.g., a 5 mm outermost edge of the substrate is not included in the statistical calculation of uniformity.

The porosity of the film can be increased with the bulk density being correspondingly decreased to cause further reduction in the dielectric constant of the material and extending the applicability of this material to future generations (e.g., k<2.0).

As previously mentioned, at least a portion of the porogen precursor to substantially all of the porogen precursor contained in the as-deposited film is removed in a subsequent removal step. The removal of the porogen precursor is performed by one or more of the following treatments: a thermal treatment, an ultraviolet treatment, an electron beam treatment, a gamma radiation treatment, and combinations thereof. In one particular embodiment, the porogen removing step is conducted by a UV treatment step, a thermal treatment step, or a combination thereof. In the latter embodiment, the UV treatment step occurs during at least a portion of the thermal treatment.

The removal of at least a portion to substantially all of the porogen contained within the as-deposited film is assumed if there is no statistically significant measured difference in atomic composition between the annealed porous OSG and the analogous OSG without added porogen. As used herein, the term "substantially free" as it relates to an removal of the porogen precursor in the as-deposited film means about 2% or less, or about 1% or less, or about 50 ppm or less or about 10 ppm or less or about 5 ppm or less of the porogen as measured by XPS or other means. The inherent measurement error of the analysis method for composition (e.g., X-ray photoelectron spectroscopy (XPS), Rutherford Backscattering/Hydrogen Forward Scattering (RBS/HFS)) and process variability both contribute to the range of the data. For XPS the inherent measurement error is Approx. +/−2 atomic %, while for RBS/HFS this is expected to be larger, ranging from +/−2 to 5 atomic % depending upon the species. The process variability will contribute a further +/−2 atomic % to the final range of the data.

Preferred embodiments of the invention provide a thin film material having a low dielectric constant and improved mechanical properties, thermal stability, and chemical resistance (to oxygen, aqueous oxidizing environments, etc.) relative to other porous low k dielectric films deposited using other structure forming precursors known in the art. The structure forming precursors described herein comprising the silacyclic compound(s) having Formula I provides a higher incorporation into the film of carbon (preferably predominantly in the form of organic carbon, —$CH_x$, where x is 1 to 3) whereby specific precursor or network-forming chemicals are used to deposit films. In certain embodiments, the majority of the hydrogen in the film is bonded to carbon.

The low k dielectric film deposited using the composition and method described herein comprise: (a) about 10 to about 35 atomic %, more preferably about 20 to about 30 atomic % silicon; (b) about 10 to about 65 atomic %, more preferably about 20 to about 45 atomic % oxygen; (c) about 10 to about 50 atomic %, more preferably about 15 to about 40 atomic % hydrogen; (d) about 5 to about 40 atomic %, more preferably about 10 to about 45 atomic % carbon. Films may also contain about 0.1 to about 15 atomic %, more preferably about 0.5 to about 7.0 atomic % fluorine, to improve one or more of materials properties. Lesser portions of other elements may also be present in certain films of the invention. OSG materials are considered to be low k materials as their dielectric constant is less than that of the standard material traditionally used in the industry—silica glass. The materials of the invention can be provided by adding pore-forming species or porogens to the deposition procedure, incorporating the porogens into the as-deposited (i.e., preliminary) OSG film and removing substantially all of the porogens from the preliminary film while substantially retaining the terminal Si—$CH_3$ groups or bridging —$(CH_2)_x$— of the preliminary film to provide the product film. The product film is porous OSG and has a dielectric constant reduced from that of the preliminary film as well as from an analogous film deposited without porogens. It is important to distinguish the film of the present invention as porous OSG, as opposed to a porous inorganic $SiO_2$, which lacks the hydrophobicity provided by the organic groups in OSG.

Silica produced by CVD TEOS, for example, has an inherent free volume pore size determined by positron annihilation lifetime spectroscopy (PALS) analysis to be about 0.6 nm in equivalent spherical diameter. The pore size of the inventive films as determined by small angle neutron scattering (SANS) or PALS is preferably less than 5 nm in equivalent spherical diameter, more preferably less than 2.5 nm in equivalent spherical diameter.

Total porosity of the film may be from 5 to 75% depending upon the process conditions and the desired final film properties. Films of the invention preferably have a density of less than 2.0 g/ml, or alternatively, less than 1.5 g/ml or less than 1.25 g/ml. Preferably, films of the invention have a density at least 10% less than that of an analogous OSG film produced without porogens, more preferably at least 20% less.

The porosity of the film need not be homogeneous throughout the film. In certain embodiments, there is a porosity gradient and/or layers of varying porosities. Such films can be provided by, e.g., adjusting the ratio of porogen to precursor during deposition.

Films of the invention have a lower dielectric constant relative to common OSG materials. Preferably, films of the invention have a dielectric constant at least 0.3 less than that of an analogous OSG film produced without porogens, more preferably at least 0.5 less. Preferably a Fourier transform infrared (FTIR) spectrum of a porous film of the invention is substantially identical to a reference FTIR of a reference film prepared by a process substantially identical to the method except for a lack of any porogen.

Films of the invention may also contain fluorine, in the form of inorganic fluorine (e.g., Si—F). Fluorine, when present, is preferably contained in an amount ranging from 0.5 to 7 atomic %.

Films of the invention are thermally stable, with good chemical resistance. In particular, preferred films after anneal have an average weight loss of less than 1.0 wt %/hr isothermal at 425° C. under $N_2$. Moreover, the films preferably have an average weight loss of less than 1.0 wt %/hr isothermal at 425° C. under air.

The films are suitable for a variety of uses. The films are particularly suitable for deposition on a semiconductor substrate, and are particularly suitable for use as, e.g., an insulation layer, an interlayer dielectric layer and/or an inter-metal dielectric layer. The films can form a conformal coating. The mechanical properties exhibited by these films make them particularly suitable for use in Al subtractive technology and Cu damascene or dual damascene technology.

The films are compatible with chemical mechanical planarization (CMP) and anisotropic etching, and are capable of adhering to a variety of materials, such as silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, organic polymers, porous organic and inorganic materials, metals such as copper and aluminum, and diffusion barrier layers such as but not limited to TiN, Ti(C)N TaN, Ta(C)N, Ta, W, WN or W(C)N. The films are preferably capable of adhering to at least one of the foregoing materials sufficiently to pass a conventional pull test, such as ASTM D3359-95a tape pull test. A sample is considered to have passed the test if there is no discernible removal of film.

Thus in certain embodiments, the film is an insulation layer, an interlayer dielectric layer, an inter-metal dielectric layer, a capping layer, a chemical-mechanical planarization (CMP) or etch stop layer, a barrier layer or an adhesion layer in an integrated circuit.

Although the films described herein are uniformly deposited dielectric films, the films as used in a full integration structure may actually consist of several sandwiched layers with for example a thin layer at the bottom or top which contains little or no porogen being deposited, or a layer may be deposited under conditions where there is a lower porogen precursor flow ratio alternatively for example a layer may be deposited at higher plasma power such that not all the porogen precursor can be removed by UV treatment. These sandwich layers may be utilized to enhance secondary integration properties such as for example adhesion, etch selectivity or electromigration performance.

Although the invention is particularly suitable for providing films and products of the invention are largely described herein as films, the invention is not limited thereto. Products of the invention can be provided in any form capable of being deposited by CVD, such as coatings, multilaminar assemblies, and other types of objects that are not necessarily planar or thin, and a multitude of objects not necessarily used in integrated circuits. Preferably, the substrate is a semiconductor.

In addition to the inventive OSG products, the present invention includes the process by which the products are made, methods of using the products and compounds and compositions useful for preparing the products. For example, a process for making an integrated circuit on a semiconductor device is disclosed in U.S. Pat. No. 6,583, 049, which is herein incorporated by reference.

The porogen in the deposited film may or may not be in the same form as the porogen introduced to the reaction chamber. As well, the porogen removal process may liberate the porogen or fragments thereof from the film. In essence, the porogen reagent (or porogen substituent attached to the precursor), the porogen in the preliminary film, and the porogen being removed may or may not be the same species, although it is preferable that they all originate from the porogen reagent (or porogen substituent). Regardless of whether or not the porogen is unchanged throughout the inventive process, the term "porogen" as used herein is intended to encompass pore-forming reagents (or pore-forming substituents) and derivatives thereof, in whatever forms they are found throughout the entire process of the invention.

Compositions of the invention can further comprise, e.g., at least one pressurizable vessel (preferably of stainless steel) fitted with the proper valves and fittings to allow the delivery of porogen, and MESCAP precursor to the process reactor. The contents of the vessel(s) can be premixed. Alternatively, porogen and precursor can be maintained in separate vessels or in a single vessel having separation means for maintaining the porogen and precursor separate during storage. Such vessels can also have means for mixing the porogen and precursor when desired.

The porogen is removed from the preliminary (or as-deposited) film by a curing step, which can comprise thermal annealing, chemical treatment, in-situ or remote plasma treating, photocuring (e.g., UV) and/or microwaving. Other in-situ or post-deposition treatments may be used to enhance materials properties like hardness, stability (to shrinkage, to air exposure, to etching, to wet etching, etc.), integrity, uniformity and adhesion. Such treatments can be applied to the film prior to, during and/or after porogen removal using the same or different means used for porogen removal. Thus, the term "post-treating" as used herein denotes treating the film with energy (e.g., thermal, plasma, photon, electron, microwave, etc.) or chemicals to remove porogens and, optionally, to enhance materials properties.

The conditions under which post-treating are conducted can vary greatly. For example, post-treating can be conducted under high pressure or under a vacuum ambient.

UV annealing is a preferred method conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), etc.). The pressure is preferably about 1 Torr to about 1000 Torr, more preferably atmospheric pressure. However, a vacuum ambient is also possible for thermal annealing as well as any other post-treating means. The temperature is preferably 200-500° C., and the temperature ramp rate is from 0.1 to 100 deg ° C./min. The total UV annealing time is preferably from 0.01 min to 12 hours.

Chemical treatment of the OSG film is conducted under the following conditions.

The use of fluorinating (HF, $SIF_4$, $NF_3$, $F_2$, $COF_2$, $CO_2F_2$, etc.), oxidizing ($H_2O_2$, $O_3$, etc.), chemical drying, methylating, or other chemical treatments that enhance the properties of the final material. Chemicals used in such treatments can be in solid, liquid, gaseous and/or supercritical fluid states.

Supercritical fluid post-treatment for selective removal of porogens from an organosilicate film is conducted under the following conditions.

The fluid can be carbon dioxide, water, nitrous oxide, ethylene, $SF_6$, and/or other types of chemicals. Other chemicals can be added to the supercritical fluid to enhance the process. The chemicals can be inert (e.g., nitrogen, $CO_2$, noble gases (He, Ar, Ne, Kr, Xe), etc.), oxidizing (e.g., oxygen, ozone, nitrous oxide, etc.), or reducing (e.g., dilute or concentrated hydrocarbons, hydrogen, etc.). The temperature is preferably ambient to 500° C. The chemicals can also include larger chemical species such as surfactants. The total exposure time is preferably from 0.01 min to 12 hours.

Plasma treating for selective removal of labile groups and possible chemical modification of the OSG film is conducted under the following conditions.

The environment can be inert (nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrogen, hydrocarbons (saturated, unsaturated, linear or branched, aromatics), etc.). The plasma power is preferably 0-5000 W. The temperature is preferably ambient to 500° C. The pressure is preferably 10 mtorr to atmospheric pressure. The total curing time is preferably 0.01 min to 12 hours.

UV curing for selective removal of porogens from an organosilicate film is conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power is preferably 0 to 5000 W. The wavelength is preferably IR, visible, UV or deep UV (wavelengths<200 nm). The total UV curing time is preferably 0.01 min to 12 hours.

Microwave post-treatment for selective removal of porogens from an organosilicate film is conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power and wavelengths are varied and tunable to specific bonds. The total curing time is preferably from 0.01 min to 12 hours.

Electron beam post-treatment for selective removal of porogens or specific chemical species from an organosilicate film and/or improvement of film properties is conducted under the following conditions.

The environment can be vacuum, inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The electron density and energy can be varied and tunable to specific bonds. The total curing time is preferably from 0.001 min to 12 hours, and may be continuous or pulsed. Additional guidance regarding the general use of electron beams is available in publications such as: S. Chattopadhyay et al., Journal of Materials Science, 36 (2001) 4323-4330; G. Kloster et al., Proceedings of IITC, Jun. 3-5, 2002, SF, CA; and U.S. Pat. Nos. 6,207,555 B1, 6,204,201 B1 and 6,132,814 A1. The use of electron beam treatment may provide for porogen removal and enhancement of film mechanical properties through bond-formation processes in matrix.

The invention will be illustrated in more detail with reference to the following Examples, but it should be understood that the it is not deemed to be limited thereto.

EXAMPLES

Exemplary films or 200 mm wafer processing were formed via a plasma enhanced CVD (PECVD) process using an Applied Materials Precision-5000 system in a 200 mm D×Z reaction chamber or vacuum chamber that was fitted with an Advance Energy 200 RF generator from a variety of different chemical precursors and process conditions. The PECVD process generally involved the following basic steps: initial set-up and stabilization of gas flows, deposition of the film onto the silicon wafer substrate, and purge/evacuation of chamber prior to substrate removal. After the deposition, the films were subjected to UV annealing. UV annealing was performed using a Fusion UV system with a broad band UV bulb, with the wafer held under a helium gas flow at one or more pressures below <10 torr and at one or more temperatures <400° C. The experiments were conducted on p-type Si wafers (resistivity range=8-12 Ohm-cm).

Thickness and refractive index were measured on an SCI FilmTek 2000 Reflectometer. Dielectric constants were determined using Hg probe technique on mid-resistivity p-type wafers (range 8-12 ohm-cm). FTIR spectra were measured using a Nicholet Nexxus 470 spectrometer. In Comparative Example 1 and Example 1 and mechanical properties were determined using MTS Nano Indenter. Compositional data were obtained by x-ray photoelectron spectroscopy (XPS) on a Physical Electronics 5000LS and are provided in atomic weight percent. The atomic weight percent % values reported in the tables do not include hydrogen.

Comparative Example 1: Deposition of Porous OSG Films from Diethyoxymethylsilane (DEMS) and Cyclooctane A composite layer of the structure former DEMS and porogen precursor cyclooctane was deposited using the following process conditions for 200 mm processing. The precursors were delivered to the reaction chamber via direct liquid injection (DLI) at a flow rate of 960 milligrams/minute (mg/min) cyclooctane and 240 mg/min using 200 standard cubic centimeters (sccm) $CO_2$ carrier gas flow, 10 sccm $O_2$, 350 milli-inch showerhead/wafer spacing, 275° C. wafer chuck temperature, 8 Torr chamber pressure to which a 600 W plasma was applied. The resulting film was then UV annealed to remove the cyclooctane porogen and mechanically enhance the film. Various attributes of the film (e.g., dielectric constant (k), modulus (GPa) and atomic weight percent carbon (% C)) were obtained as described above and are provided in Table 1.

Comparative Example 2: Deposition of Porous OSG Films from 1,1-Diethoxy-1-silacyclobutane (DESCB) and Cyclooctane A composite layer of the structure former DEMS and porogen precursor cyclooctane was deposited using the following process conditions for 200 mm processing. The precursors were delivered to the reaction chamber via direct liquid injection (DLI) at a flow rate of 1120 milligrams/minute (mg/min) cyclooctane and 280 mg/min using 200 standard cubic centimeters (sccm) $CO_2$ carrier gas flow, 20 sccm O2, 350 milli-inch showerhead/wafer spacing, 250° C. wafer chuck temperature, 8 Torr chamber pressure to which a 700 W plasma was applied. The resulting film was then UV annealed to remove the cyclooctane porogen and mechanically enhance the film. Various attributes of the film (e.g., dielectric constant (k), modulus (GPa) and atomic weight percent carbon (% C)) were obtained as described above and are provided in Table 1.

Example 1: Deposition of Porous OSG Film from 1-Methyl-1-Ethoxy-1-silacyclopentane (MESCAP) and Cyclooctane A composite layer of structure former MESCAP and porogen precursor cyclooctane was deposited using the following process conditions for 200 mm processing. The precursors were delivered to the reaction chamber via direct liquid injection (DLI) at flow rate of 960 mg/min cyclooctane and 240 mgm of MESCAP were delivered to the chamber via DLI using 200 sccm $CO_2$ carrier gas flow, 20 sccm O2, 350 milli-inch showerhead/wafer spacing, 250° C. wafer chuck temperature, 8 Torr chamber pressure to which a 600 W plasma was applied. The resulting film was then UV annealed to remove the porogen and mechanically enhance the film. Various attributes of the film (e.g., dielectric constant (k), modulus (GPa) and atomic weight percent carbon (% C)) were obtained as described above and are provided in Table 1.

Example 2: Deposition of Porous OSG Film from 1-Methyl-1-isopropoxy-1-silacyclopentane (MPSCAP) and Cyclooctane A composite layer of structure former MPSCAP and porogen precursor cyclooctane was deposited using the following process conditions for 200 mm processing. The precursors were delivered to the reaction chamber via direct liquid injection (DLI) at flow rate of 840 mg/min cyclooctane and 360 mgm of MPSCAP were delivered to the chamber via DLI using 200 sccm $CO_2$ carrier gas flow, 20 sccm O2, 350 milli-inch showerhead/wafer spacing, 250° C. wafer chuck temperature, 8 Torr chamber pressure to which a 700 W plasma was applied. The resulting film was then UV annealed to remove the porogen and mechanically enhance the film. Various attributes of the film (e.g., dielectric constant (k), modulus (GPa) and atomic weight percent carbon (% C)) were obtained as described above and are provided in Table 1.

TABLE 1

Comparative Film Properties for films deposited using DEMS, MESCAP, MPSCAP, or DESCB with cyclooctane as the porogen precursor.

| Film | k | Modulus (Gpa) | % C (XPS) |
|---|---|---|---|
| DEMS/Cyclooctane | 2.32 | 7.57 | 13.2% |
| MESCAP/Cyclooctane | 2.36 | 6.90 | 22.6% |
| MPSCAP/Cyclooctane | 2.4 | 6.30 | 27% |
| DESCB/cyclooctane | 2.33 | 5.15 | 23.4% |

TABLE 2

Film Properties for MESCAP/Cyclooctane Deposited Under Various Conditions with Chamber Pressure of 8 torr and Temperature of 250° C.

| Power (watts) | MESCAP Flow (mg/min) | Cyclooctane Flow (mg/min) | $O_2$ Flow (sccm) | Dielectric | Modulus (GPa) | Hardness (GPa) | % C | % O | % Si |
|---|---|---|---|---|---|---|---|---|---|
| 600 | 200 | 800 | 10 | 2.4 | 7.15 | 1.28 | 31 | 37.2 | 31.6 |
| 600 | 240 | 960 | 10 | 2.44 | 8.67 | 1.51 | 25.4 | 42.6 | 32.2 |

TABLE 2-continued

Film Properties for MESCAP/Cyclooctane Deposited Under Various Conditions with Chamber Pressure of 8 torr and Temperature of 250° C.

| Power (watts) | MESCAP Flow (mg/min) | Cyclooctane Flow (mg/min) | $O_2$ Flow (sccm) | Dielectric | Modulus (GPa) | Hardness (GPa) | % C | % O | % Si |
|---|---|---|---|---|---|---|---|---|---|
| 600 | 300 | 700 | 10 | 2.45 | 8.39 | 1.54 | 30.9 | 37.7 | 31.4 |
| 600 | 360 | 840 | 10 | 2.49 | 10.48 | 1.9 | 27 | 41.7 | 31.1 |
| 600 | 330 | 770 | 15 | 2.39 | 8.31 | 1.58 | 24.6 | 42.7 | 32.2 |
| 600 | 330 | 770 | 20 | 2.36 | 7.96 | 1.53 | 22.6 | 44.4 | 33 |

Tables 1 and 2 show that films made using MESCAP, and the isopropoxy derivative MPSCAP, as the structure former and the cyclooctane porogen precursor have an increased amount of carbon and similar modulus relative to films made using the DEMS structure-forming precursor and the same porogen. Table 1 also includes data for Comparative Example 2 wherein 1,1-diethoxy-1-silacyclobutane, a symmetric silacyclic compound was used as the structure former precursor and had a higher % C than the DEMS-deposited films but lower mechanical properties.

Example 3: Depositions for Dielectric Films Using DEMS, MESCAP, and MESCAP and a Hardening Additive (HA) as the Structure Former and Cyclooctane as the Porogen Precursor Certain experiments used three hundred (300) mm wafer processing which were conducted on an Applied Materials Producer® SE. Like the 200 mm processing described above, the PECVD process generally involved the following basic steps: initial set-up and stabilization of gas flows, deposition of the film onto the silicon wafer substrate, and purge/evacuation of chamber prior to substrate removal. The 300 mm depositions were conducted on a Producer® SE Twin low k chamber configured with a TEOS faceplate (AMAT part number: 0040-95475). The chamber is fitted with an Advanced Energy APEX 3013 RF generator (two per twin chamber). Helium was used as the carrier gas for all depositions on the Producer. As-deposited films from the Producer® SE low k chamber were UV-cured on the Producer® SE NanoCure™ UV chamber under an argon gas flow at one or more pressures <10 Torr pressure and at one or more pedestal set point temperatures ≤400° C. The experiments were conducted on p-type Si wafers (resistivity range=8-12 Ohm-cm).

Thickness and refractive index were measured on an SCI FilmTek 2000 Reflectometer. For Examples 3 and the 300 mm films, mechanical properties of the films were measured by nanoindentation using an Agilent G200 Nanoindenter. Indentations are performed to a maximum penetration depth of 50% film thickness with a DCM indenter head using the continuous stiffness measurement (CSM) option. Modulus and hardness measurements are reported at 10% of the film thickness. Further, the modulus measurements are compensated for the elastic influence of the silicon substrate. Because of this compensation for substrate influence, the reported moduli are roughly 25% less than the values which would be determined by the Oliver-Pharr analysis alone. FTIR spectra for 300 mm wafers were collected using a Thermo Fisher Scientific Model iS 50 spectrometer fitted with a Pike Technologies Map300 for handling 12 inch wafers. FTIR spectra for 200 mm wafers were measured using a Nicolet Nexxus 470 spectrometer. Dielectric constants were performed using a Materials Development Corporation (MDC) mercury probe calibrated with thermal oxides standards.

Atomic composition was determined using X-Ray photospectrometry (XPS) on a PHI 5000VersaProbe Spectrometer equipped with Multiple Channel Plates (MCD) and a focused Al monochromatic X-ray source. Bulk composition is examined over a 200 μm area after removal of ~2000 Å by $Ar^+$ sputtering. The atomic % values reported in the tables do not include hydrogen.

Figure 2:
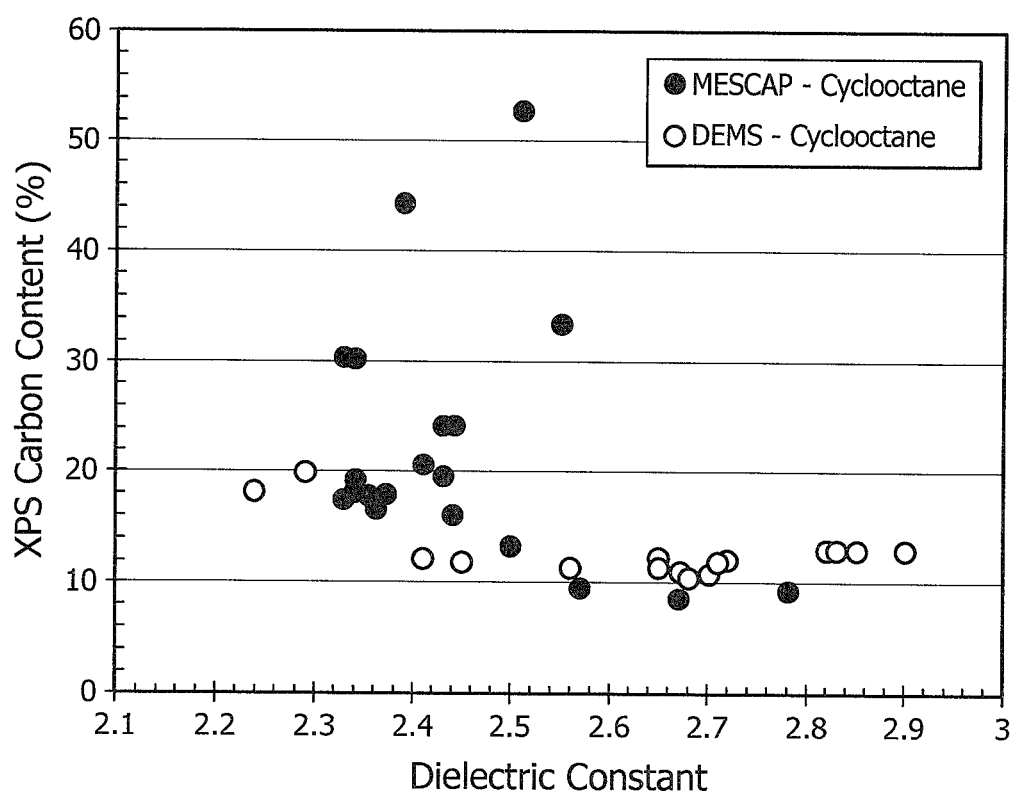
FIG. 2 is a graph that compares the carbon content vs. dielectric constant for exemplary porous low k dielectric films using the method and composition described herein comprising the structure former MESCAP and the porogen cyclooctane and prior art exemplary films comprising the structure former DEMS and the porogen cyclooctane.

A series of depositions of porous low k dielectric films were deposited using either DEMS or MESCAP as the structure former and cyclooctane as the porogen precursor on a 200 mm PECVD reactor under a variety of process conditions range from 500-700 W plasma power, 5-9 torr chamber pressure, 0.30-0.60 inch electrode spacing, 200-300 C substrate temperature, 10-50 sccm O2 flow, 200-400 sccm $CO_2$ or He carrier gas flow, 0.9-1.5 gram/minute total liquid flow of a 30:70-10:90 ratio of OSG precursor to Cyclooctane porogen precursor. The carbon content was measured by XPS as described herein. FIG. 2 shows the relationship between the carbon content (%) of porous low k DEMS/cyclooctane and MESCAP/cyclooctane films having different dielectric constants. As FIG. 2 shows, the prior art or DEMS/cyclooctane porous low k films had a narrow range of carbon content or from about 10 to about 20 atomic % as the dielectric constant increased from about ~2.3 to about ~2.8. By contrast, the MESCAP/cyclooctane films described herein had a wider range of carbon content or from about 9 to about 50 atomic % over the same dielectric constant range. This illustrates one of the important advantages of using the alkyl-alkoxysilacyclic compounds described herein such as MESCAP versus other prior art structure formers for depositing a porous low K dielectric film which is for similar values of the dielectric constant, the alkyl-alkoxysilacyclic precursor MESCAP permits a much wider and tunable range of carbon content.

Table 3 provides a comparison of porous low k films with a dielectric constant of k=2.4 using either DEMS, MESCAP, or a composition comprising MESCAP and a hardening additive (HA) which was tetraethyl orthosilicate as the structure former and cyclooctane as the porogen precursor. Processing conditions for a given film were adjusted to obtain a high elastic modulus, high carbon content, or both and are provided in Table 3. All films were processed using standard UV cure times as determined by the time it takes to reach maximum mechanical strength without negatively impacting the dielectric constant. Compared to the DEMS/Cyclooctane film, the two MESCAP/Cyclooctane films contained a significantly greater carbon content, while maintaining a similar elastic modulus. Further, the MESCAP/Cyclooctane films in Table 3 show that for a given dielectric constant, the ability to deposit high elastic modulus films with a tunable carbon content that greatly exceeds that of prior art structure formers such as DEMS. In addition, for a given class of films (e.g., MESCAP/cyclooctane), the elastic modulus decreases as the carbon content increases.

content in the film while maintaining mechanical properties because a HA can be introduced into the composition without a detrimental loss in carbon content.

TABLE 3 k = 2.4 Porous low-k films.

|  | DEMS/ Cyclooctane | MESCAP/ Cyclooctane | MESCAP/ Cyclooctane | MESCAP/HA/ Cyclooctane | MESCAP/HA/ Cyclooctane |
|---|---|---|---|---|---|
| Power (W) | 700 | 900 | 600 | 600 | 631 |
| Temperature (° C.) | 285 | 280 | 280 | 280 | 280 |
| Pressure (Torr) | 8.0 | 8.0 | 8.0 | 7.5 | 7.5 |
| Porogen Flow (mg/min) | 3150 | 4375 | 3062 | 3062 | 3850 |
| Structure Former Flow (mg/min) | 350 | 625 | 438 | 438 | 550 |
| O2 Flow (sccm) | 87.5 | 50 | 50 | 100 | 100 |
| Relative UV Cure Time | 1.1X | 1.0 | 1.0 | 1.0 | 1.0 |
| Dielectric Constant | 2.4 | 2.4 | 2.4 | 2.4 | 2.4 |
| Elastic Modulus (Gpa) | 7.1 | 6.5 | 7.4 | 8 | 9.2 |
| % Carbon | 12 | 26 | 15 | 13 | 11 |
| % Oxygen | 54 | 42 | 50 | 53 | 55 |
| % Silicon | 34 | 33 | 35 | 34 | 34 |

Table 3 also provides two porous low k films that used a mixture of MESCAP and a hardening additive (HA) tetraethyl orthosilicate as the structure former and cyclooctane as the porogen precursor. In these examples, the structure former was a 50:50 mixture of MESCAP and hardening additive by weight. Referring to the data in Table 3, the HA decreased the carbon content of the film but increased the elastic modulus of the film. Relative to the comparative DEMS/cyclooctane film, the k=2.4 MESCAP/HA/cyclooctane film with an elastic modulus of 8.0 GPa had a higher elastic modulus (a 13% increase) and a greater carbon content (a 8% increase). The other k=2.4, MESCAP/Hardening Additive/cyclooctane film in Table 3 exhibits an elastic modulus of 9.2 GPa and a carbon content of 11%. The later film containing the HA in the structure former had a significant increase in the elastic modulus (a 30% increase), but a decrease in the carbon content (a 8% decrease) relative to the comparative DEMS/cyclooctane film. The examples in Table 3 illustrate that the inherently higher carbon content of MESCAP provides a clear advantage as a structure former since a hardening additive can be introduced into the structure former composition without a detrimental loss in carbon content.

Table 4 provides a comparison of porous low k films with a dielectric constant of k=2.3 using either DEMS, MESCAP, or a composition comprising MESCAP and a HA or tetraethyl orthosilicate as the structure former and cyclooctane as the porogen precursor. Processing conditions for a given film were adjusted to obtain a high elastic modulus, high carbon content, or both and are provided in Table 4. The first column in Table 4 shows a MESCAP/cyclooctane deposited film with an elastic modulus of 5.7 GPa and a carbon content of 24 atomic percent. The second column in Table 4 shows a MESCAP/cyclooctance deposited film with an elastic modulus of 6.0 GPa and a carbon content of 17%. These films illustrate that the carbon content of the films using MESCAP as the structure former can be adjusted from 17 to 25 atomic percent with almost no impact on the elastic modulus. The third entry in Table 4 shows a MESCAP/HA/cyclooctane deposited film with an elastic modulus of 7.9 GPa and a carbon content of 14%. The later exemplary films shows that the use of the alkyl-alkoxysilacyclic precursor MESCAP provides or maintains the relatively higher carbon

TABLE 4 k = 2.3 Porous low-k films.

|  | MESCAP/ Cyclooctane | MESCAP/ Cyclooctane | MESCAP/HA/ Cyclooctane |
|---|---|---|---|
| Power (W) | 803 | 600 | 695 |
| Temperature (° C.) | 280 | 280 | 280 |
| Pressure (Torr) | 8.0 | 8.0 | 7.5 |
| Porogen Flow (mg/min) | 3500 | 3150 | 4025 |
| Structure Former Flow (mg/min) | 500 | 350 | 575 |
| O2 Flow (sccm) | 50 | 50 | 140 |
| Relative UV Cure Time | 1.0 | 1.0 | 1.0 |
| Dielectric Constant | 2.3 | 2.3 | 2.3 |
| Elastic Modulus (Gpa) | 5.7 | 6 | 7.9 |
| % Carbon | 24 | 17 | 14 |
| % Oxygen | 33 | 48 | 33 |
| % Silicon | 43 | 35 | 53 |

Table 5 provides a further example of the inherent advantage of the alkyl-alkoxysilacyclic precursor MESCAP for deposited porous low k films having a dielectric constant of 2.6. The first column in Table 5 shows a DEMS/cyclooctane film with a high elastic modulus of 11 GPa and a carbon content of 11%. By contrast, the MESCAP/cyclooctane film had an equivalent elastic modulus (11 GPa), but an higher carbon content of 15 atomic percent (a 36 percent increase relative to the comparative DEMS based film).

TABLE 5 k = 2.6 Porous low-k films.

|  | DEMS/ Cyclooctane | MESCAP/ Cyclooctane |
|---|---|---|
| Power (W) | 700 | 600 |
| Temperature (° C.) | 285 | 285 |
| Pressure (Torr) | 8.0 | 8.0 |
| Porogen Flow (mg/min) | 4050 | 4375 |
| Structure Former Flow (mg/min) | 450 | 625 |
| O2 Flow (sccm) | 87.5 | 50 |
| Relative UV Cure Time | 1.1 | 1.0 |
| Dielectric Constant | 2.6 | 2.6 |
| Elastic Modulus (Gpa) | 11 | 11 |
| % Carbon | 11 | 15 |
| % Oxygen | 53 | 51 |
| % Silicon | 36 | 34 |

Figure 3:
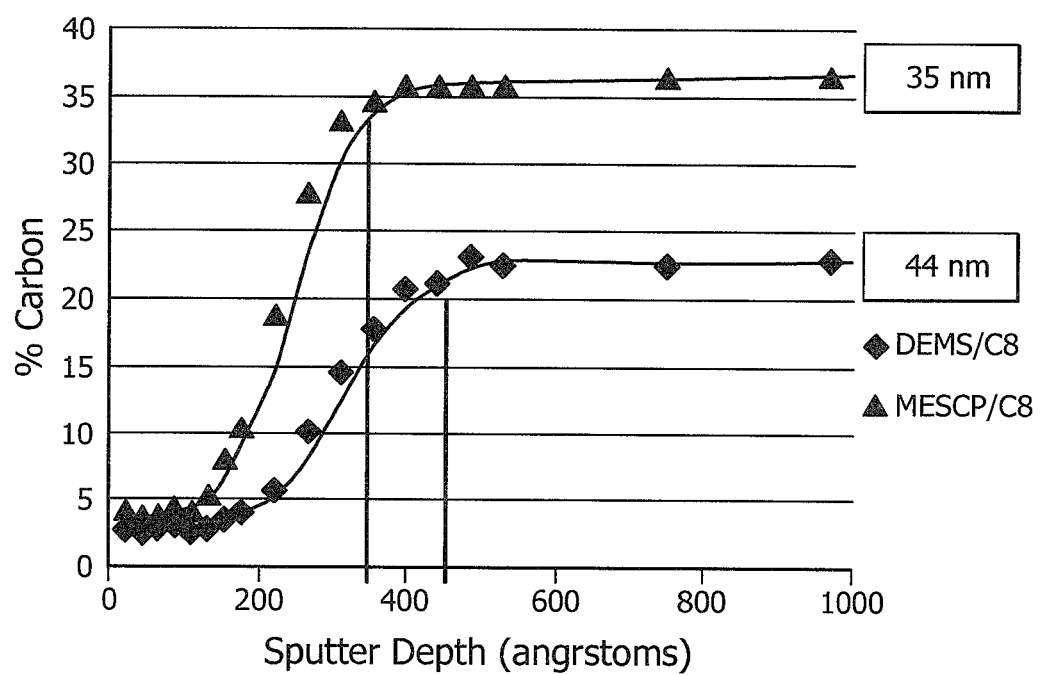
FIG. 3 demonstrates the increased resistance to carbon removal when the film is damaged using a $NH_3$ plasma.

FIG. 3 shows with a dielectric constant of about 2.3 were deposited as in Example 1 using MESCAP (▲) or Comparative Example 1 using DEMS (●) as the structure-forming precursor and cyclooctane as the porogen precursor. Both films were exposed to a 15 second $NH_3$ plasma at 100 W plasma power to model the plasma damage conditions seen in integration. The depth of the damage is indicated by the depth to which the carbon was removed from the film as detected by XPS depth profiling sputtering. FIG. 3 shows that a higher carbon content was retained for the films deposited using MESCAP as the structure-forming precursor compared to films deposited using DEMS as the structure-forming precursor and that the depth of damage as indicated by the depth to which the carbon was removed from the film is less for the films deposited using MESCAP.

Although illustrated and described above with reference to certain specific embodiments and examples, the present invention is nevertheless not intended to be limited to the details shown. Rather, various modifications may be made in the details within the scope and range of equivalents of the claims and without departing from the spirit of the invention. It is expressly intended, for example, that all ranges broadly recited in this document include within their scope all narrower ranges which fall within the broader ranges.

The invention claimed is:

1. A composition for a vapor deposition of a dielectric film comprising a silacyclic compound having the following Formula I:

(I)

wherein $R^1$ is independently selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group; $R^2$ is selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group; and $R^3$ is selected from a $C_3$ to $C_{10}$ alkyl di-radical which forms a four-membered, five-membered, or six-membered cyclic ring with the Si atom, wherein the compound is substantially free of at least one impurity selected from the group consisting of halides and water.

2. The composition of claim 1 wherein the silacyclic compound comprises at least one selected from the group consisting of 1-methyl-1-methoxy-1-silacyclopentane, 1-methyl-1-ethoxy-1-silacyclopentane, 1-methyl-1-isopropoxy-1-silacyclopentane, 1-methyl-1-propoxy-1-silacyclopentane, 1-methoxy-1-silacyclopentane, 1-ethoxy-1-silacyclopentane, 1-methyl-1-methoxy-1-silacyclobutane, 1-methyl-1-ethoxy-1-silacyclobutane, 1-methoxy-1-silacyclobutane, 1-ethoxy-1-silacyclobutane, 1-methyl-1-methoxy-1-silacyclohexane, 1-methyl-1-ethoxy-1-silacyclohexane, 1-methyl-1-methoxy-1-silacyclohexane, 1-methyl-1-ethoxy-1-silacyclohexane, 1-methyl-1-isopropoxy-1-silacyclopentane, 1-methyl-1-isopropoxy-1-silacyclobutane, 1-methyl-1-isopropoxy-1-silacyclohexane, 1-isopropoxy-1-silacyclopentane, 1-isopropoxy-1-silacyclobutane, 1-isopropoxy-1-silacyclohexane and combinations thereof.

3. The composition of claim 1, wherein the halides comprise chloride ions.

4. The composition of claim 3, wherein the chloride ions, if present, are present at a concentration of 50 ppm or less.

5. The composition of claim 3, wherein the composition has 0 ppm of chloride ion.

6. The composition of claim 4, wherein the chloride ions, if present, are present at a concentration of 10 ppm or less.

7. The composition of claim 6, wherein the chloride ions, if present, are present at a concentration of 5 ppm or less.

8. The composition of claim 2 wherein the silacyclic compound comprises 1-methyl-1-isopropoxy-1-silacyclopentane.

9. The composition of claim 2 wherein the silacyclic compound comprises 1-methyl-1-ethoxy-1-silacyclopentane.

10. The composition of claim 8, wherein the halides comprise chloride ions.

11. The composition of claim 10, wherein the chloride ions, if present, are present at a concentration of 50 ppm or less.

12. The composition of claim 11, wherein the chloride ions, if present, are present at a concentration of 10 ppm or less.

13. The composition of claim 12, wherein the chloride ions, if present, are present at a concentration of 5 ppm or less.

14. The composition of claim 13, wherein the composition has 0 ppm of chloride ion.

* * * * *